United States Patent
Lee

(10) Patent No.: US 8,581,385 B2
(45) Date of Patent: Nov. 12, 2013

(54) SEMICONDUCTOR CHIP TO DISSIPATE HEAT, SEMICONDUCTOR PACKAGE INCLUDING THE SAME, AND STACK PACKAGE USING THE SAME

(75) Inventor: Jin Hui Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 316 days.

(21) Appl. No.: 12/979,304

(22) Filed: Dec. 27, 2010

(65) Prior Publication Data

US 2011/0304038 A1 Dec. 15, 2011

(30) Foreign Application Priority Data

Jun. 9, 2010 (KR) ........................ 10-2010-0054415

(51) Int. Cl.
| | |
|---|---|
| H01L 23/48 | (2006.01) |
| H01L 29/06 | (2006.01) |
| H01L 23/04 | (2006.01) |
| H01L 23/10 | (2006.01) |
| H01L 23/34 | (2006.01) |
| H01L 23/52 | (2006.01) |
| H01L 29/40 | (2006.01) |

(52) U.S. Cl.
USPC ........... 257/698; 257/276; 257/625; 257/706; 257/777; 257/E23.08

(58) Field of Classification Search
USPC ............ 257/276, 625, 698, 706, 777, E23.08; 361/679.54, 697, 709; 174/548
See application file for complete search history.

(56) References Cited

U.S. PATENT DOCUMENTS

| | | | | |
|---|---|---|---|---|
| 5,510,655 | A * | 4/1996 | Tanielian | 257/774 |
| 6,087,719 | A * | 7/2000 | Tsunashima | 257/686 |
| 6,608,371 | B2 * | 8/2003 | Kurashima et al. | 257/686 |
| 6,611,052 | B2 * | 8/2003 | Poo et al. | 257/686 |
| 7,429,792 | B2 * | 9/2008 | Lee et al. | 257/712 |
| 7,514,636 | B2 * | 4/2009 | Sasaki | 174/252 |
| 7,649,249 | B2 * | 1/2010 | Noguchi | 257/686 |
| 8,159,066 | B2 * | 4/2012 | Yang | 257/717 |
| 2007/0257355 | A1 * | 11/2007 | Suzuki et al. | 257/698 |
| 2007/0262441 | A1 * | 11/2007 | Chen | 257/706 |
| 2007/0262443 | A1 * | 11/2007 | Val et al. | 257/706 |
| 2009/0180257 | A1 * | 7/2009 | Park et al. | 361/709 |
| 2009/0184414 | A1 * | 7/2009 | Park et al. | 257/698 |

FOREIGN PATENT DOCUMENTS

| | | |
|---|---|---|
| JP | 2001-338932 A | 12/2001 |
| KR | 1020060070140 A | 6/2006 |

* cited by examiner

*Primary Examiner* — Teresa M Arroyo
(74) *Attorney, Agent, or Firm* — William Park & Associates Patent Ltd.

(57) ABSTRACT

A semiconductor chip includes a semiconductor chip body having a top surface, a bottom surface, and side surfaces. The bottom surface may have a groove pattern defined by removing a partial thickness of the semiconductor chip body to extend from one or more edges of the semiconductor chip body toward a center portion of the semiconductor chip body. Through electrodes may be formed to extend from the top surface of the semiconductor chip body and pass through the groove pattern defined on the bottom surface. A heat dissipation pattern may fill in the groove pattern defined on the bottom surface and may be connected with the through electrodes.

20 Claims, 7 Drawing Sheets

SEMICONDUCTOR CHIP TO DISSIPATE HEAT, SEMICONDUCTOR PACKAGE INCLUDING THE SAME, AND STACK PACKAGE USING THE SAME

CROSS-REFERENCE TO RELATED APPLICATIONS

The present application claims priority to Korean patent application number 10-2010-0054415 filed on Jun. 9, 2010, which is incorporated herein by reference in its entirety.

BACKGROUND OF THE INVENTION

The present invention relates to a semiconductor chip, a semiconductor package using the semiconductor chip, and a stack package using the semiconductor package, which can effectively dissipate the heat generated therein during operation.

These days, as the semiconductor device manufacturing technology has been developed, semiconductor packages having semiconductor devices capable of processing an increased amount of data within a short time have been disclosed in the art.

Semiconductor packages are manufactured through a semiconductor chip manufacturing process for manufacturing semiconductor chips on a wafer made of silicon with high purity, a die sorting process for electrically inspecting the semiconductor chips, and a packaging process for packaging good quality semiconductor chips.

Recently, a chip scale package, which has a size no greater than about 100% to 105% of the size of a semiconductor chip, and a stack package, in which a plurality of semiconductor chips are stacked, have been developed in the art.

The stack package provides advantages in that, since the plurality of semiconductor chips are stacked, data capacity is significantly increased. The heat generated during the operation of the stack package will need to be appropriately dissipated.

BRIEF SUMMARY OF THE INVENTION

Embodiments of the present invention are directed to a semiconductor chip, a semiconductor package using the semiconductor chip, and a stack package using the semiconductor package, which can effectively dissipate the heat generated therein during operation.

In one embodiment of the present invention, a semiconductor chip includes a semiconductor chip body having a top surface, a bottom surface, and side surfaces. The bottom surface may comprise a groove pattern defined by, for example, removing a partial thickness of the semiconductor chip body to extend from one or more edges of the semiconductor chip body toward a center portion of the semiconductor chip body. Through electrodes may be formed to extend from the top surface through the groove pattern defined on the bottom surface. A heat dissipation pattern may be formed to fill in the groove pattern on the bottom surface and to connect with the through electrodes.

A width of the groove pattern may correspond to a diameter of the through electrodes or be greater than the diameter of the through electrodes.

The semiconductor chip may further include heat dissipation members formed on one or more side surfaces of the semiconductor chip body to be connected with the heat dissipation pattern. The heat dissipation members may be formed on the side surfaces of the semiconductor chip body and may be disposed to be separated from one another. The heat dissipation members may be respectively formed on overall areas of the side surfaces of the semiconductor chip body in such a way as to be integrated with one another and surround the side surfaces of the semiconductor chip body. The heat dissipation pattern may include a heat transfer material layer.

The groove pattern may have a line portion that extends from one or more side surfaces of the semiconductor chip body, and enlarged portions that extend from the line portion and surround the through electrodes.

The semiconductor chip may further include an insulation layer pattern interposed between the heat dissipation pattern and the bottom surface of the semiconductor chip body including the groove pattern.

The heat dissipation pattern may have a first heat dissipation pattern formed in the line portion of the groove pattern and second heat dissipation patterns formed in the enlarged portions of the groove pattern.

The first heat dissipation pattern may include a heat transfer material layer, and the second heat dissipation patterns may include any of copper, aluminum and gold.

The semiconductor chip may further include an additional insulation layer pattern formed on the bottom surface of the semiconductor chip body including the insulation layer pattern in such a way as to cover the bottom surface of the semiconductor chip body while having slits that expose the heat dissipation pattern and the through electrodes.

The semiconductor chip may further include an additional heat dissipation pattern filled in the slit of the additional insulation layer pattern and connected with the heat dissipation pattern. The additional heat dissipation pattern may include a heat transfer material layer.

In another embodiment of the present invention, a semiconductor package includes a semiconductor chip including a semiconductor chip body with a bottom surface having a groove pattern defined by, for example, removing a partial thickness of the semiconductor chip body to extend from one or more side surfaces toward a center portion of the semiconductor chip body. Through electrodes may be formed to extend from a top surface of the semiconductor chip body and pass through the groove pattern defined on the bottom surface. A heat dissipation pattern may be formed to fill in the groove pattern defined on the bottom surface and be connected with the through electrodes. There may also be a substrate on which the semiconductor chip is mounted, the substrate having connection pads that may be connected with the through electrodes.

The semiconductor package may further include an encapsulant formed to seal an upper surface of the substrate including the semiconductor chip and external connection terminals attached to a lower surface of the substrate.

In another embodiment of the present invention, a stack package includes at least two vertically stacked semiconductor chips. Each semiconductor chip may include a semiconductor chip body that may have on its bottom surface a groove pattern defined by removing a partial thickness of the semiconductor chip body to extend from one or more side surfaces toward a center portion of the semiconductor chip body. Through electrodes may also be formed to extend from a top surface of the semiconductor chip body and to pass through the groove pattern defined on the bottom surface. Heat dissipation pattern may be formed to fill in the groove pattern defined on the bottom surface and be connected with the through electrodes, wherein the stacked semiconductor chips may be disposed such that their through electrodes contact each other to be electrically connected with each other.

The stack package may further include heat transfer adhesives interposed between the stacked semiconductor chips. Each of the stacked semiconductor chips may further include heat dissipation members which are formed on one or more side surfaces of the semiconductor chip body to be connected with the heat dissipation pattern.

The heat dissipation members may be respectively formed on the side surfaces of the semiconductor chip body and may be disposed to be separated from one another. The heat dissipation members may be respectively formed on overall areas of the side surfaces of the semiconductor chip body in such a way as to be integrated with one another and surround the side surfaces of the semiconductor chip body.

The stack package may further include an additional heat transfer adhesive covering the top surface of an uppermost semiconductor chip among the stacked semiconductor chips. The stack package may also include an additional heat dissipation member formed to be disposed on the additional heat transfer adhesive and be connected with the heat dissipation members. The stack package may further include a substrate on which the stacked semiconductor chips are mounted, the substrate having connection pads connected with the through electrodes of a lowermost semiconductor chip among the stacked semiconductor chips.

DESCRIPTION OF SPECIFIC EMBODIMENTS

Specific embodiments of the present invention will be described in detail with reference to the accompanying drawings. It is to be understood that the drawings are not necessarily to scale and in some instances proportions may have been exaggerated in order to more clearly depict certain features of the invention.

Figure 1:
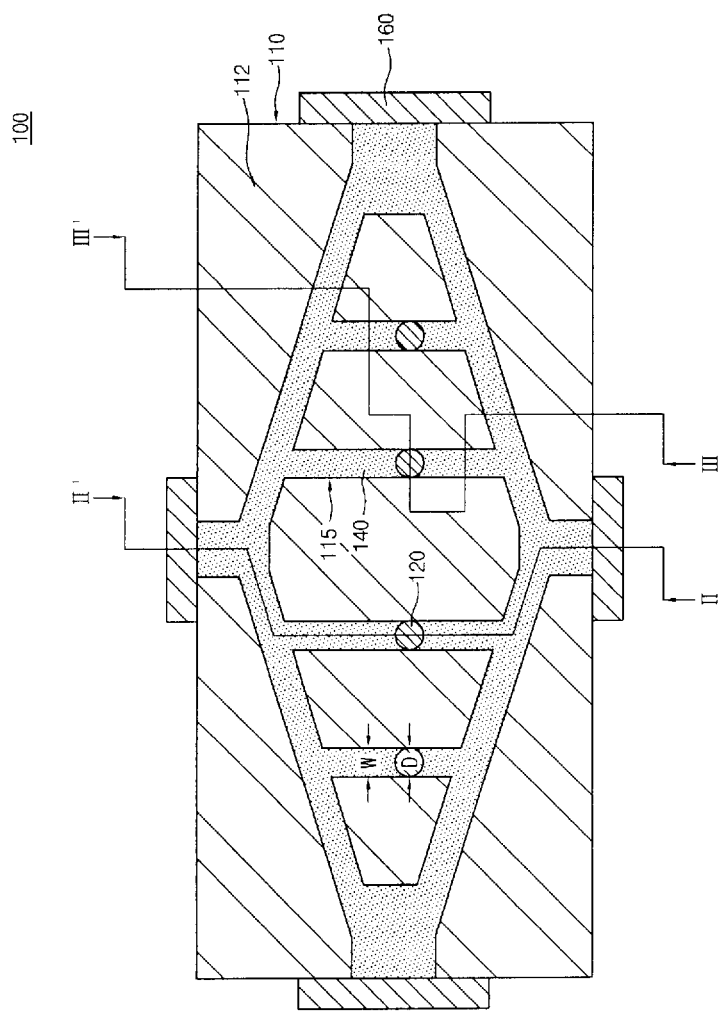
FIG. 1 is a bottom view illustrating a bottom surface of a semiconductor chip in accordance with an embodiment of the present invention.
Figure 2:
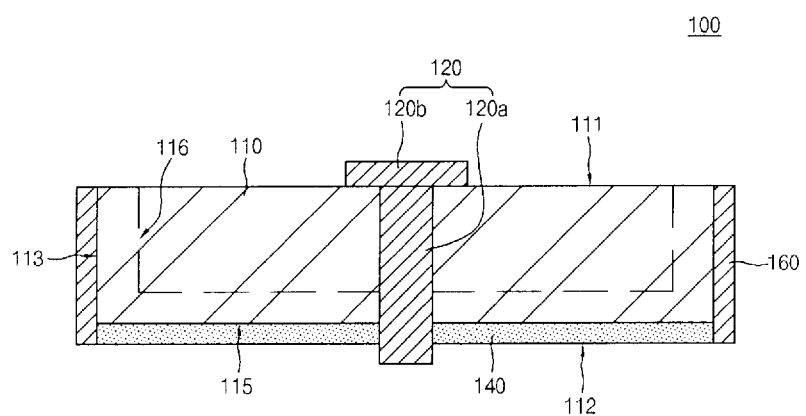
FIG. 2 is a cross-sectional view taken along the line II-II' of FIG. 1.
Figure 3:
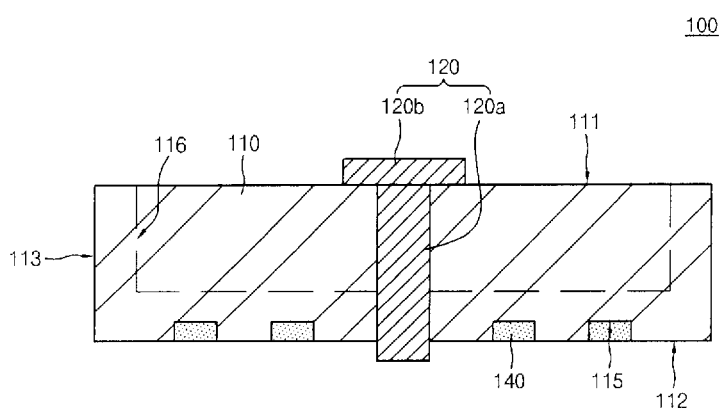
FIG. 3 is a cross-sectional view taken along the line III-III' of FIG. 1.

FIG. 1 is a bottom view illustrating a bottom surface of a semiconductor chip in accordance with an embodiment of the present invention, FIG. 2 is a cross-sectional view taken along the line II-II' of FIG. 1, and FIG. 3 is a cross-sectional view taken along the line III-III' of FIG. 1.

Referring to FIGS. 1 through 3, a semiconductor chip 100 in accordance with an embodiment of the present invention includes a semiconductor chip body 110, through electrodes 120, and a heat dissipation pattern 140. The semiconductor chip 100 can further include heat dissipation members 160.

The semiconductor chip body 110 has a circuit unit 116 and bonding pads (not shown). The semiconductor chip body 110 can possess, for example, a rectangular hexahedral shape. The semiconductor chip body 110 may have a surface 111, a bottom surface 112, and side surfaces 113. The bottom surface 112 of the semiconductor chip body 110 may have a groove pattern 115. The groove pattern 115 may be defined by removing a partial thickness of the semiconductor chip body 110 to extend from one or more side surfaces 113 toward the center portion of the semiconductor chip body 110. FIG. 1 shows example groove pattern 115 that extends from the four respective side surfaces 113 toward the center portion of the semiconductor chip body 110.

The circuit unit 116 may comprise, for example, a data storage section (not shown) for storing data and a data processing section (not shown) for processing the data stored in the data storage section. The bonding pads can be electrically connected with the data storage section and/or the data processing section. The bonding pads may be used as signal input/output terminals from/to outside the semiconductor chip 100.

The through electrodes 120 are formed to extend from the top surface 111 and to pass through the groove pattern 115 of the bottom surface 112 of the semiconductor chip body 110. The through electrodes 120 may also be formed to extend from the groove pattern 115 of the bottom surface 112 and to pass through the top surface 111 of the semiconductor chip body 110. Each through electrode 120 can have a through portion 120a formed in the semiconductor chip body 110 and a pad portion 120b that extends from one end of the through portion 120a and projects out of the top surface 111 of the semiconductor chip body 110. The through portion 120a of the through electrode 120 can be formed to project from the bottom surface 112 of the semiconductor chip body 110.

The through electrodes 120 can be disposed along the center portion or the peripheral portions of the semiconductor chip body 110. The through electrodes 120 can be formed to directly pass through the bonding pads disposed on the top surface 111 of the semiconductor chip body 110 and can be electrically connected with the bonding pads. The through-electrodes 120 may also be formed not to directly pass through the bonding pads disposed on the one surface 111 of the semiconductor chip body 110. In this case, redistribution lines (not shown) may be formed to connect the bonding pads and the through electrodes 120.

The width W of the groove pattern 115 on the bottom surface 112 of the semiconductor chip body 110 can correspond, for example, to the diameter D of the through electrodes 120.

The heat dissipation pattern 140 may be formed in such a way as to fill in the groove pattern 115 defined on the bottom surface 112 and be connected with the through electrodes 120. The heat dissipation pattern 140 can be formed to contact the outer surfaces of the through portions 120a of the through electrodes 120 that are exposed in the groove pattern 115. The heat dissipation pattern 140 can include a thermal interface material that has a desired heat conductivity and electrical insulation characteristic.

The heat dissipation members 160 are disposed on one or more side surfaces 113 of the semiconductor chip body 110 and are formed to be connected with the heat dissipation pattern 140. The heat dissipation members 160 can include conductive patterns or conductive pins. The heat dissipation members 160 can be respectively formed on the respective side surfaces 113 of the semiconductor chip body 110 in such a way as to be separated from one another.

The semiconductor chip in accordance with an embodiment of the present invention includes a heat dissipation pattern formed in a groove pattern defined on the bottom surface of a semiconductor chip body in such a way as to be connected with through electrodes, and heat dissipation members formed on side surfaces of the semiconductor chip body in such a way as to be connected with the heat dissipation pattern. By this construction, the heat generated by a semiconductor chip may be dissipated in a horizontal direction and/or a vertical direction through the heat dissipation pattern and the heat dissipation members.

Figure 4:
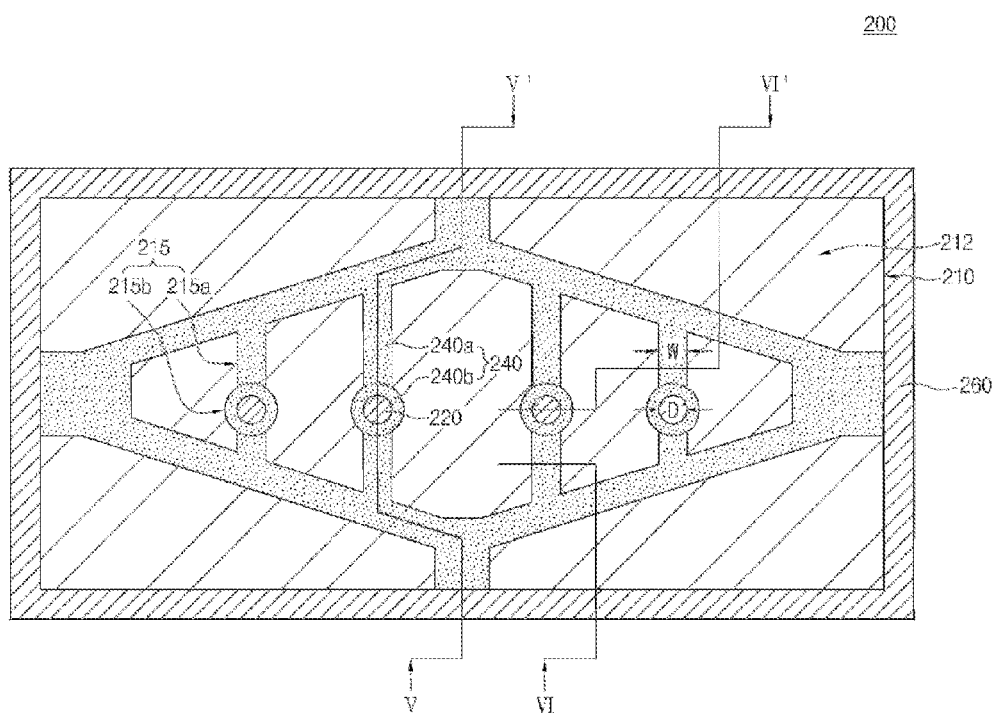
FIG. 4 is a bottom view illustrating a bottom surface of a semiconductor chip in accordance with an embodiment of the present invention.
Figure 5:
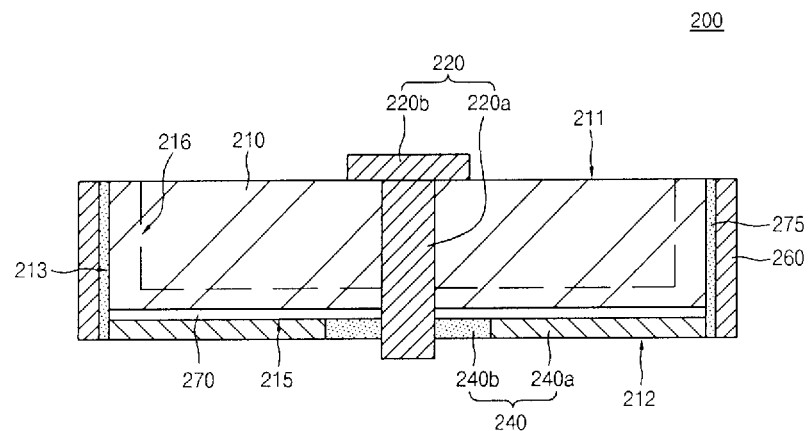
FIG. 5 is a cross-sectional view taken along the line V-V' of FIG. 4.
Figure 6:
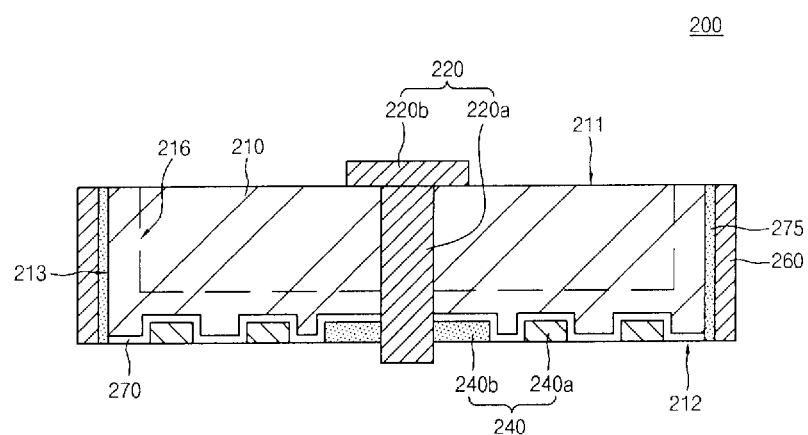
FIG. 6 is a cross-sectional view taken along the line VI-VI' of FIG. 4.

FIG. 4 is a bottom view illustrating the bottom surface of a semiconductor chip in accordance with an embodiment of the present invention, FIG. 5 is a cross-sectional view taken along the line V-V' of FIG. 4, and FIG. 6 is a cross-sectional view taken along the line VI-VI' of FIG. 4.

Referring to FIGS. 4 through 6, a semiconductor chip 200 in accordance with an embodiment of the present invention includes a semiconductor chip body 210, through electrodes 220, and a heat dissipation pattern 240. The semiconductor chip 200 can further include heat dissipation members 260 and an insulation layer pattern 270.

The semiconductor chip body 210 has a circuit unit 216 and bonding pads (not shown). The semiconductor chip body 210 can possess, for example, a rectangular hexahedral shape. The semiconductor chip body 210 possessing the rectangular hexahedral shape has a top surface 211, a bottom surface 212, and side surfaces 213.

The bottom surface 212 of the semiconductor chip body 210 has a groove pattern 215. The groove pattern 215 is defined by removing a partial thickness of the semiconductor chip body 210 to extend from one or more side surfaces 213 toward the center portion of the semiconductor chip body 210. The groove pattern 215 can have a line portion 215a that extends from one or more side surfaces 213 of the semiconductor chip body 210, and enlarged portions 215b that extend from the line portion 215a and surround the through electrodes 220. When viewed from the top, the line portion 215a of the groove pattern 215 can have, for example, a plate-like shape, and each of the enlarged portions 215b of the groove pattern 215 can have, for example, a donut-like shape.

The circuit unit 216 may comprise, for example, a data storage section (not shown) for storing data and a data processing section (not shown) for processing the data stored in the data storage section. The bonding pads can be electrically connected with the data storage section and/or the data processing section. The bonding pads may be used as signal input/output terminals from/to outside the semiconductor chip 200.

The through electrodes 220 are formed to extend from the top surface 211 and to pass through the groove pattern 215 of the bottom surface 212 of the semiconductor chip body 210. The through electrodes 220 may also be formed to extend from the groove pattern 215 of the bottom surface 212 and to pass through the top surface 211 of the semiconductor chip body 210.

Each through electrode 220 can have a through portion 220a formed in the semiconductor chip body 210 and a pad portion 220b that extends from one end of the through portion 220a and projects out of the top surface 211 of the semiconductor chip body 210. The through portion 220a of the through electrode 220 can be formed to project from the other surface 212 of the semiconductor chip body 210.

The width W of the groove pattern 215 can be, for example, greater than the diameter D of the through electrodes 220.

The heat dissipation pattern 240 may be a first heat dissipation pattern 240a formed in the line portion 215a of the groove pattern 215 and second heat dissipation patterns 240b formed in the enlarged portions 215b of the groove pattern 215. The first heat dissipation pattern 240a can be formed, for example, of a first material that may conduct electricity and heat, and the second heat dissipation patterns 240b can be formed of a second material that may conduct heat while having electrical insulation characteristic. The first material may be material such as, for example, copper, aluminum, gold, or an alloy, and the second material can include a thermal interface material.

Since the groove pattern 215 may be defined to have the width W greater than the diameter D of the through electrodes 220, the contact area between the heat dissipation pattern 240 filled in the groove pattern 215 and each of the through electrodes 220 may be increased, and the heat generated in the through electrodes 220 during the operation of the semiconductor chip 200 can be effectively dissipated outside the semiconductor chip 200.

The first heat dissipation pattern 240a may be separated from the through electrodes 220, and the second heat dissipation patterns 240b may be formed to contact the through electrodes 220. The first heat dissipation pattern 240a may be connected to the through electrodes 220 by the second heat dissipation patterns 240b.

The heat dissipation members 260 may be formed on one or more side surfaces 213 of the semiconductor chip body 210 in such a way as to be connected with the heat dissipation pattern 240 by a heat transfer adhesive layer 275. The heat dissipation members 260 can be formed on the overall areas of the side surfaces 213 of the semiconductor chip body 210 in such a way as to be integrated with one another and surround the side surfaces 213 of the semiconductor chip body 210. The heat dissipation members 260 can include conductive patterns or conductive pins.

The insulation layer pattern 270 may be interposed between the chip body 210 and the heat dissipation pattern 240 and the bottom surface 212. The heat dissipation pattern 240 may be formed selectively over the bottom surface 212. The heat dissipation pattern 240 may also be formed on the overall area of the bottom surface 212 of the semiconductor chip body 210. The insulation layer pattern 270 may electrically insulate the heat dissipation pattern 240 filled in the groove pattern 215 from the semiconductor chip body 210.

In the semiconductor chip in accordance with the second embodiment of the present invention, a heat dissipation pattern, which has first and second heat dissipation patterns respectively formed of first and second materials, is formed in a groove pattern of a semiconductor chip body, and heat dissipation members are formed on side surfaces of the semiconductor chip body in such a way as to be connected with the heat dissipation pattern.

Figure 7:
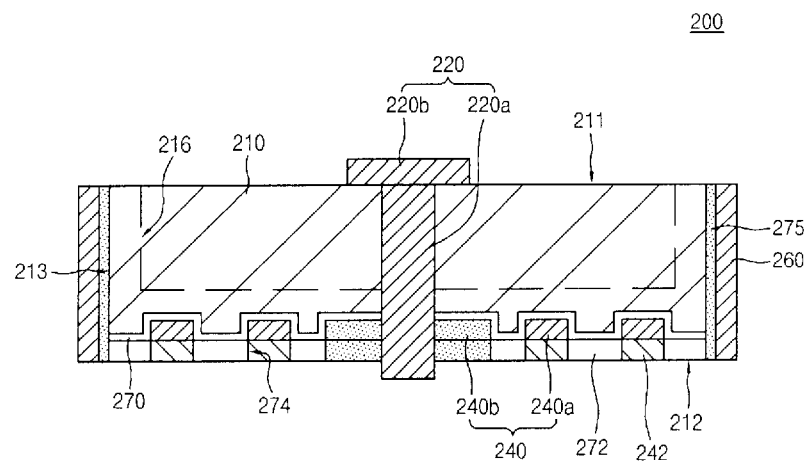
FIG. 7 is a cross-sectional view illustrating a semiconductor chip in accordance with an embodiment of the present invention.

FIG. 7 is a cross-sectional view illustrating a semiconductor chip in accordance with an embodiment of the present invention. In this embodiment of the present invention, the same reference numerals will be used to refer to the same or like component parts as those of the embodiment shown with respect to FIGS. 4-6.

Referring to FIG. 7, a semiconductor chip 200 in accordance with an embodiment of the present invention includes a semiconductor chip body 210, through electrodes 220, a heat dissipation pattern 240, and heat dissipation members 260. The semiconductor chip 200 can further include an additional insulation layer pattern 272 and an additional heat dissipation pattern 242.

The additional insulation layer pattern 272 can be formed on the bottom surface 212 of the semiconductor chip body 210 including an insulation layer pattern 270 in such a way as to cover the bottom surface 212 of the semiconductor chip body 210 while having slits 274 expose the heat dissipation pattern 240 and the through electrodes 220.

The additional heat dissipation pattern 242 may fill the slit 274 of the additional insulation layer pattern 272 and may connect with the heat dissipation pattern 240. The additional heat dissipation pattern 242 can include a heat transfer material layer.

While not shown in a drawing, in the case where the heat dissipation pattern 240 is formed of only a heat transfer material layer, the insulation layer pattern 270 disposed inside the additional insulation layer pattern 272 may not be formed.

Figure 8:
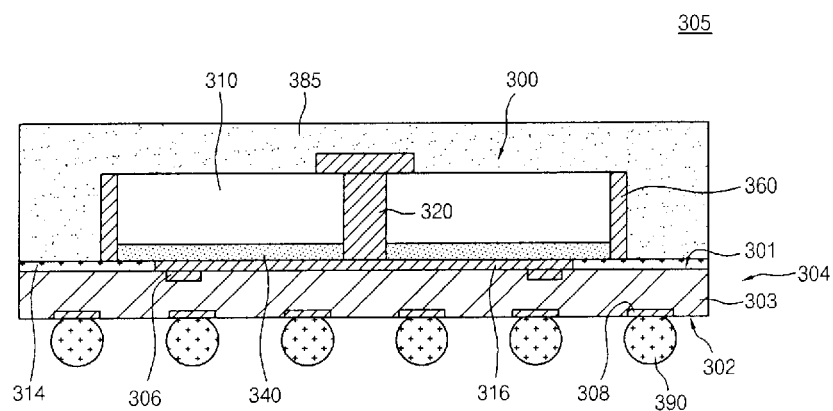
FIG. 8 is a cross-sectional view illustrating a semiconductor package in accordance with an embodiment of the present invention.

FIG. 8 is a cross-sectional view illustrating a semiconductor package in accordance with an embodiment of the present invention. Referring to FIG. 8, a semiconductor package 305 includes a substrate 304 and a semiconductor chip 300. The semiconductor package 305 can further include an encapsulant 385 and external connection terminals 390. The semiconductor chip 300 may be, for example, any one of the semiconductor chips 100 and 200 described in FIGS. 1-7.

The substrate 304 supports the semiconductor chip 300 and has connection pads 306 connected to through electrodes 320 of the semiconductor chip 300. The substrate 304 includes a substrate body 303 that has an upper surface 301 and a lower surface 302, and circuit patterns (not shown) that have the connection pads 306 formed on the upper surface 301 and ball lands 308 formed on the lower surface 302.

The connection pads 306 can be disposed at a first position, and the through electrodes 320 can be disposed at a second position corresponding to the first position. In this case, the connection pads 306 and the through electrodes 320 can be directly connected electrically with each other. For example, the first position can be the center portion or the peripheral portion of the substrate 304, and the second position can be a similar center portion or peripheral portion of the semiconductor chip 300.

The connection pads 306 may also be disposed at a first position, and the through electrodes 320 can be disposed at a second position different from the first position. In this case, the substrate 304 can further have redistribution lines 316 connect the connection pads 306 to the through electrodes 320. For example, in the case where the first position is the center portion of the substrate 304, the second position can be the peripheral portion of the semiconductor chip 300, and in the case where the first position is the peripheral portion of the substrate 304, the second position can be the center portion of the semiconductor chip 300.

The substrate 304 and the semiconductor chip 300 can be attached physically to each other by an adhesive 314. The adhesive 314 may be, for example, an adhesive having a heat transfer characteristic.

The encapsulant 385 is formed to seal the upper surface 301 of the substrate 304 including the semiconductor chip 300. The encapsulant 385 may be material such as, for example, an EMC (epoxy molding compound).

The external connection terminals 390 are attached to the ball lands 308 disposed on the lower surface 302 of the substrate 304. The external connection terminals 390 can include, for example, solder balls.

Figure 9:
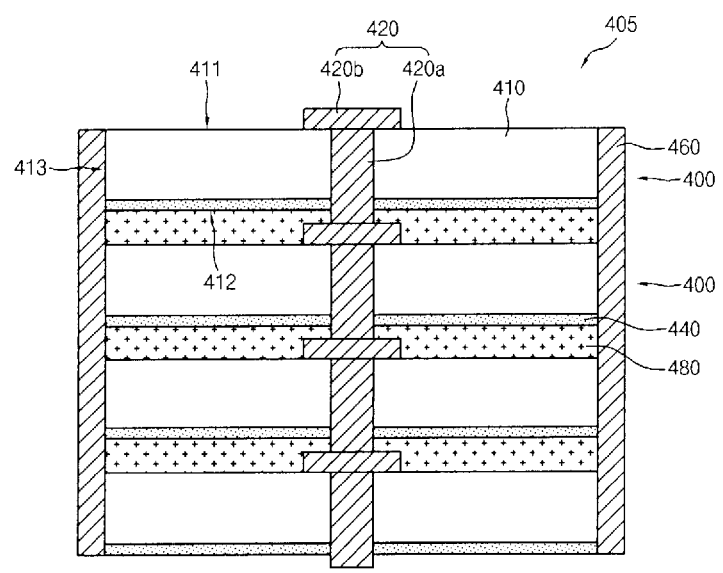
FIG. 9 is a cross-sectional view illustrating a stack package in accordance with an embodiment of the present invention.
Figure 10:
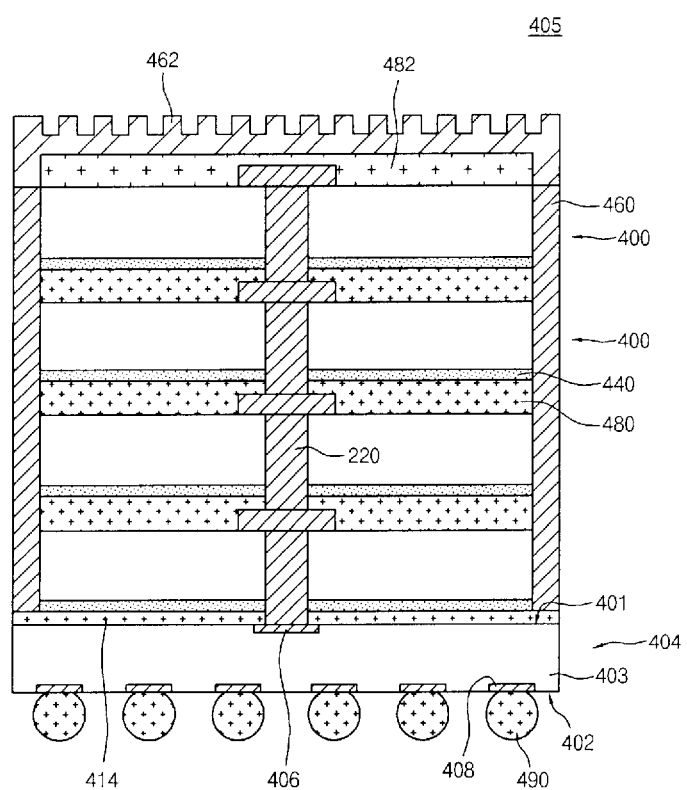
FIG. 10 is a cross-sectional view illustrating in detail the stack package in accordance with an embodiment of the present invention.

FIG. 9 is a cross-sectional view illustrating a stack package in accordance with an embodiment of the present invention, and FIG. 10 is a cross-sectional view illustrating in detail the stack package described in FIG. 9. Referring to FIG. 9, a stack package 405 in accordance with an embodiment of the present invention includes two or more stacked semiconductor chips 400.

Each semiconductor chip 400 comprises a semiconductor chip body 410, through electrodes 420, and a heat dissipation pattern 440. The semiconductor chip body 410 has a top surface 411, a bottom surface 412, and side surfaces 413. The bottom surface 412 of the semiconductor chip body 410 has a groove pattern (not shown) that may be defined by removing a partial thickness of the semiconductor chip body 410 to extend from one or more side surfaces 413 toward the center portion of the semiconductor chip body 410. The through electrodes 420 are formed to extend from the top surface 411 of the semiconductor chip body 410 and to pass through the groove pattern of the bottom surface 412 of the semiconductor chip body 410. The heat dissipation pattern 440 is formed in such a way as to be filled in the groove pattern of the bottom surface 412 and be connected with the through electrodes 420.

Each semiconductor chip 400 can further have heat dissipation members 460 formed on one or more side surfaces 413 of the semiconductor chip body 410 in such a way as to be connected with the heat dissipation pattern 440.

The heat dissipation members 460 can be respectively formed on the respective side surfaces 413 of the semiconductor chip body 410 in such a way as to be separated from one another. The heat dissipation members 460 may also be formed on the overall areas of the side surfaces 413 of the semiconductor chip body 410 in such a way as to be integrated with one another and surround the side surfaces 413 of the semiconductor chip body 410.

The two or more semiconductor chips 400 may be vertically stacked. The stacked semiconductor chips 400 may be attached physically to one another by, for example, heat transfer adhesives 480. The stacked semiconductor chips 400 may be electrically connected with one another by solders (not shown) disposed between the semiconductor chips 400.

The stacked semiconductor chips 400 may also be electrically and physically connected with one another by anisotropic conductive films (not shown) disposed between the semiconductor chips 400.

Referring to FIG. 10, the stack package 405 can further include a substrate 404 on which the stacked semiconductor chips 400 are mounted and which has connection pads 406 to be connected with the through electrodes 420 of the lowermost semiconductor chip 400 among the stacked semiconductor chips 400. Also, the stack package 405 can further include an additional heat transfer adhesive 482 and an additional heat dissipation member 462.

The substrate 404 includes a substrate body 403 with an upper surface 401 and a lower surface 402, and circuit patterns (not shown) that include the connection pads 406 formed on the upper surface 401 and ball lands 408 formed on the lower surface 402.

The substrate 404 and the lowermost semiconductor chip 400 can be physically attached to each other by an adhesive 414. The adhesive 414 may be, for example, an adhesive having a heat transfer characteristic.

The external connection terminals 490 are attached to the ball lands 408 disposed on the lower surface 402 of the substrate 404. The external connection terminals 490 can include, for example, solder balls.

The additional heat transfer adhesive 482 is attached onto the uppermost semiconductor chip 400 among the stacked semiconductor chips 400, and the additional heat dissipation member 462 is attached onto the additional heat transfer adhesive 482 and is connected with the heat dissipation members 460 disposed on the side surfaces 413 of the stacked semiconductor chips 400.

In the stack package according to an embodiment of the present invention, the heat generated therein during operation can be dissipated in a horizontal direction and/or a vertical direction by a heat dissipation pattern and heat dissipation members of each semiconductor chip, which are connected with through electrodes.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
   a semiconductor chip body having a top surface, a bottom surface and side surfaces connecting the top surface and the bottom surface wherein a bottom surface of the semiconductor chip body possesses a groove pattern extending from one or more edges of the semiconductor chip body toward a center portion of the semiconductor chip body;
   through electrodes extending from a top surface of the semiconductor chip body and passing through the groove pattern defined on the bottom surface; and
   a heat dissipation pattern filling in the groove pattern contacting the through electrodes.

2. The semiconductor chip according to claim 1, wherein a width of the groove pattern corresponds to a diameter of the through electrodes.

3. The semiconductor chip according to claim 1, wherein a width of the groove pattern is greater than a diameter of the through electrodes.

4. The semiconductor chip according to claim 1, further comprising:
   a heat dissipation member formed on at least two of the side surfaces of the semiconductor chip body and connected the with heat dissipation pattern.

5. The semiconductor chip according to claim 4, wherein the heat dissipation members are separated from one another.

6. The semiconductor chip according to claim 4, wherein the heat dissipation members cover the side surfaces in such a way as to be integrated with one another and surround the side surfaces of the semiconductor chip body.

7. The semiconductor chip according to claim 1, wherein the heat dissipation pattern is formed of a heat transfer material layer.

8. The semiconductor chip according to claim 1, wherein the groove pattern has a line portion extending from one or more side surfaces of the semiconductor chip body outlining the groove pattern, and the heat dissipation pattern has an enlarged portion extending from the line portion and surrounding the through electrodes.

9. The semiconductor chip according to claim 8, further comprising:
   an insulation layer pattern interposed between the heat dissipation pattern and the bottom surface of the semiconductor chip body including the groove pattern.

10. The semiconductor chip according to claim 8, wherein the heat dissipation pattern has a first heat dissipation pattern formed in the line portion of the groove pattern and second heat dissipation patterns formed in the enlarged portions of the groove pattern.

11. The semiconductor chip according to claim 10, wherein the first heat dissipation pattern is formed of a heat transfer material layer and the second heat dissipation patterns are formed of one of copper, aluminum and gold.

12. The semiconductor chip according to claim 9, further comprising:
    an additional insulation layer pattern formed on the bottom surface of the semiconductor chip body including the insulation layer pattern in such a way as to cover the bottom surface of the semiconductor chip body while having slits exposing the heat dissipation pattern and the through electrodes.

13. The semiconductor chip according to claim 12, further comprising:
    an additional heat dissipation pattern filled in the slit of the additional insulation layer pattern and connected with the heat dissipation pattern.

14. The semiconductor chip according to claim 13, wherein the additional heat dissipation pattern is formed of a heat transfer material layer.

15. A semiconductor package comprising:
    a semiconductor chip including a semiconductor chip body having a top surface and a bottoms surface that has a groove pattern extending from one or more edges of the semiconductor chip body toward a center portion of the semiconductor chip body, through electrodes extending from a top surface of the semiconductor chip body and passing through the groove pattern defined on the bottom surface, and a heat dissipation pattern filling in the groove pattern on the bottom surface and contacting the through electrodes; and
    a substrate on which the semiconductor chip is mounted, the substrate having connection pads connected with the through electrodes.

16. The semiconductor package according to claim 15, further comprising:
    an encapsulant formed to seal an upper surface of the substrate including the semiconductor chip; and
    external connection terminals attached to a lower surface of the substrate.

17. A stack package comprising:
    at least two vertically stacked semiconductor chips;
    each semiconductor chip including
    a semiconductor chip body having a top surface, a bottom surface with a groove pattern extending from one or more edges of the semiconductor chip body toward a center portion of the semiconductor chip body, and side surfaces connecting the top surface and the bottom surface,
    through electrodes extending from a top surface of the semiconductor chip body and passing through the groove pattern defined on the bottom surface, and
    a heat dissipation pattern filling the groove pattern on the bottom surface and contacting the through electrodes,
    wherein the stacked semiconductor chips are disposed such that their through electrodes contact each other to be electrically connected with each other.

18. The stack package according to claim 17, wherein each of the stacked semiconductor chips further includes heat dissipation members formed on one or more side surfaces of the semiconductor chip body to be connected with the heat dissipation pattern.

19. The stack package according to claim 17, further comprising:
    a heat transfer adhesive covering the top surface of an uppermost semiconductor chip among the stacked semiconductor chips.

20. The stack package according to claim 19, further comprising:
   an additional heat dissipation member disposed on the additional heat transfer adhesive and connected with the heat dissipation members.

* * * * *